US009231575B2

(12) United States Patent
Koester (10) Patent No.: US 9,231,575 B2
(45) Date of Patent: Jan. 5, 2016

(54) CIRCUIT AND METHOD FOR GENERATING PERIODIC CONTROL SIGNALS, AND MICROSCOPE AND METHOD FOR CONTROLLING A MICROSCOPE

(71) Applicant: LEICA MICROSYSTEMS CMS GMBH, Wetzlar (DE)

(72) Inventor: Thorsten Koester, Edingen-Neckarhausen (DE)

(73) Assignee: LEICA MICROSYSTEMS CMS GMBH, Wetzlar (DE)

( * ) Notice: Subject to any disclaimer, the term of this patent is extended or adjusted under 35 U.S.C. 154(b) by 0 days.

(21) Appl. No.: 13/895,424

(22) Filed: May 16, 2013

(65) Prior Publication Data
US 2013/0307603 A1 Nov. 21, 2013

(30) Foreign Application Priority Data

May 18, 2012 (DE) .......................... 10 2012 208 379
Sep. 10, 2012 (DE) .......................... 10 2012 216 002

(51) Int. Cl.
*H03K 5/13* (2014.01)
*H03K 5/15* (2006.01)
*G02B 21/16* (2006.01)

(52) U.S. Cl.
CPC *H03K 5/15* (2013.01); *G02B 21/16* (2013.01); *H03K 5/131* (2013.01); *H03K 5/15013* (2013.01)

(58) Field of Classification Search
USPC ....................................................... 327/258
See application file for complete search history.

(56) References Cited

U.S. PATENT DOCUMENTS

| 4,027,261 | A  | * | 5/1977 | Laurent et al. ................... 327/98 |
| 6,906,571 | B1 |   | 6/2005 | Nguyen |
| 2005/0059681 | A1 | * | 3/2005 | Cremer et al. ............. 514/260.1 |
| 2007/0011538 | A1 | * | 1/2007 | Chen ............................. 714/733 |
| 2009/0066390 | A1 | * | 3/2009 | Ide et al. ........................ 327/276 |
| 2009/0202166 | A1 | * | 8/2009 | Yamaguchi et al. .......... 382/254 |

FOREIGN PATENT DOCUMENTS

| EP | 0363931 A2 | 4/1990 |
| EP | 0618678 A2 | 10/1994 |
| GB | 2475768 A | 6/2011 |
| WO | 2006023427 A2 | 3/2006 |

* cited by examiner

*Primary Examiner* — Lincoln Donovan
*Assistant Examiner* — Patrick Chen
(74) *Attorney, Agent, or Firm* — Leydig, Voit & Mayer, Ltd.

(57) ABSTRACT

A circuit is configured to generate periodic control signals including at least two mutually phase-shifted control signals. The circuit includes a plurality of generator circuits, where a separate generator circuit is provided for each control signal output by the circuit. Each generator circuit includes a phase value memory configured to store a phase value, where the phase value defines a phase shift. Each generator circuit includes an activation input and, in response to application of an activation level to the activation input, is configured to initiate a generation of a control signal which is phase-shifted by an amount defined by the phase value. The activation inputs of the generator circuits are connected together to an activation circuit for outputting an activation level to the generator circuits simultaneously.

12 Claims, 5 Drawing Sheets

CIRCUIT AND METHOD FOR GENERATING PERIODIC CONTROL SIGNALS, AND MICROSCOPE AND METHOD FOR CONTROLLING A MICROSCOPE

CROSS REFERENCE TO RELATED APPLICATIONS

This application claims priority to German Patent Application Nos. DE 10 2012 208 379.0, filed May 18, 2012, and DE 10 2012 216 002.7, filed Sep. 10, 2012, which are hereby incorporated by reference herein in their entirety.

FIELD

The present invention relates to a circuit for generating periodic control signals, in particular for a microscope, the circuit being configured to generate and output at least two mutually phase-shifted control signals. The invention also relates to a corresponding method.

Moreover, the present invention relates to a microscope having a plurality of electrically and/or electronically controllable components, and to a method for controlling a microscope.

BACKGROUND

Mutually phase-shifted control signals are frequently needed in engineering applications. For the generation of periodic, mutually phase-shifted control signals, it is important that the phase relationship between the control signals be well-defined. In practice, this mostly means that control signals must be synchronous; i.e., the control signals have the same period duration, or at least period durations which are integral multiples of each other.

One application where high-accuracy control signals are required is in microscopes, in particular confocal microscopes, such as STED and FLIM microscopes. There, two or more phase-shifted synchronous control signals are needed to control the illumination laser and, if applicable, the detection device.

Stimulated emission depletion (STED) microscopes achieve resolutions beyond the limit that is theoretically achievable by optical microscopes; i.e., it is possible to resolve structures smaller than $\lambda/2$ of the illuminating light. In order to achieve this, one makes use of the effect that illumination of a fluorescing sample with a wavelength near the fluorescence wavelength causes the sample to change from an excited state to a de-excited state. In a STED microscope, a fluorescent sample is initially excited by a short wavelength laser beam, and subsequently de-excited by a long wavelength laser beam, the long wavelength laser beam having a ring-shaped intensity distribution which is nearly zero in the center. In this way, it is possible to achieve resolutions down to 30 nm and below. In order to achieve resolutions as high as this, it is essential to control the timing of the lasers as accurately as possible.

This applies similarly to fluorescence lifetime imaging (FLIM) microscopes, which measure the "lifetime" of an excited state of a fluorescent molecule. In FLIM with PIE (Pulse Interleaved Excitation), the sample is alternately excited by lasers having different wavelengths. There, too, the laser must be controlled such that they have a well-defined temporal relationship to each other.

Figure 1:
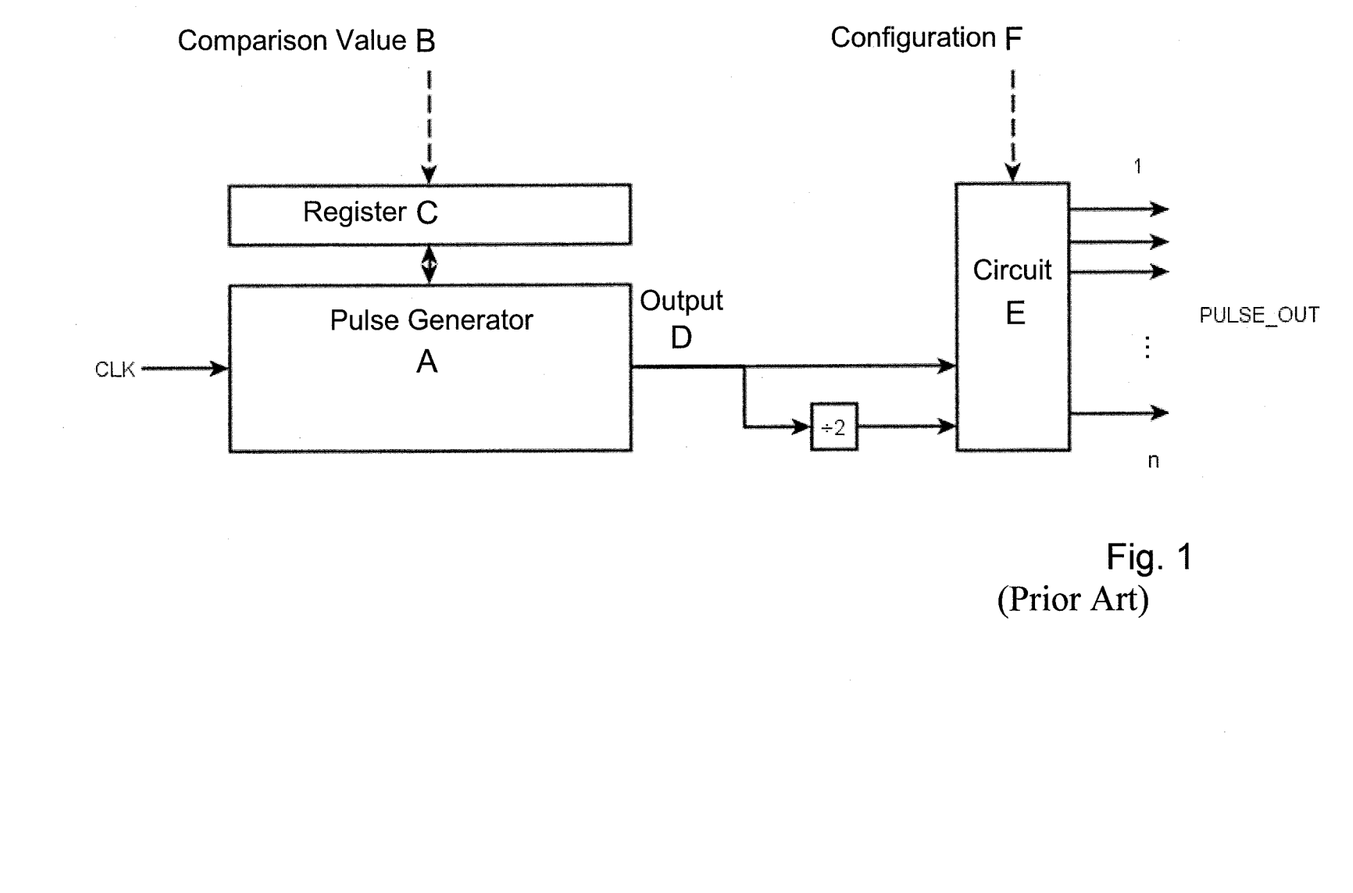
FIG. 1 shows a prior art circuit for generating control signals.

A circuit for generating such control signals, as is known in the art, is schematically shown in FIG. 1. A clock signal CLK is applied to a pulse generator A, which is often implemented as an up counter. When a comparison value B stored in a register C is reached, a pulse having the width of an active level of clock signal CLK is provided at output D of pulse generator A and the counter is reset. The pulse train provided at output D and an additional signal generated from this pulse train by a clock divider are transmitted to a circuit E, which generates and outputs the control signals. Circuit E is substantially formed by a multiplexer and a digital logic circuit and is adjustable within certain limits by a configuration F. Depending on configuration F, control signals PULSE_OUT1 through n are provided at the outputs of circuit E. Mostly, mutually phase-shifted signals are needed only at two of the outputs.

Figure 2A:
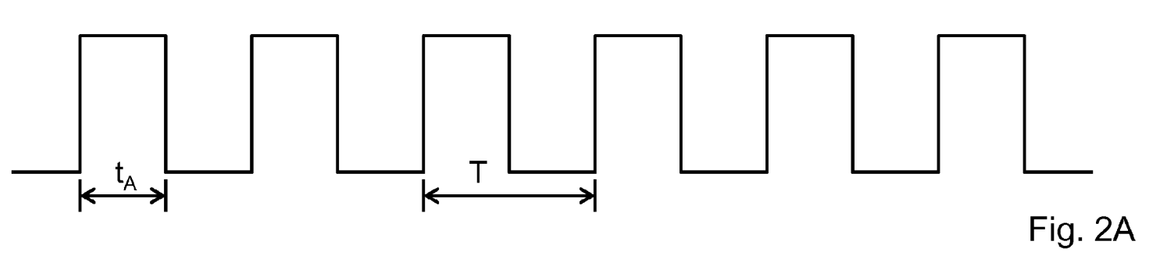
FIGS. 2A, 2B, and 2C show exemplary waveforms of control signals.

In order to facilitate the understanding of the underlying principle, FIG. 2 shows a greatly simplified example of different pulse trains. FIG. 2A shows a pulse train as is output by pulse generator A at output D. For the sake of simplicity, the pulse train is assumed to be identical to the applied clock signal CLK. This can be achieved by storing in register C a comparison value equal to 1. Thus, at each clock edge, the counter reaches the comparison value, whereupon a pulse is generated and the counter is reset. The pulse train has a period duration T, and each of the active levels of the pulse train has a width $t_A$.

Figure 2B:
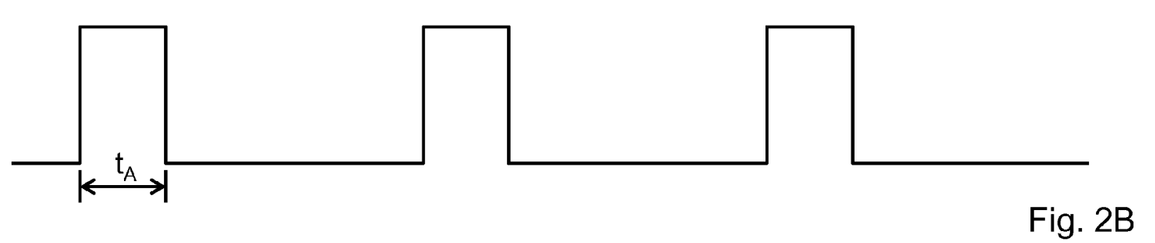
Figure 2C:
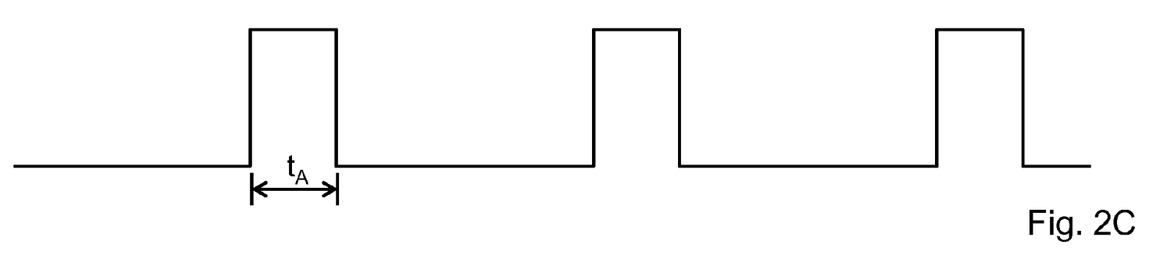

Circuit E generates from this pulse train the pulse trains shown in FIGS. 2B and 2C; the pulse train of FIG. 2C being phase-shifted by 180° with respect to the pulse train of FIG. 2B.

This prior art circuit has the disadvantage of providing little flexibility. Apart from some minor configuration options, the definition of circuit E determines the output signals of the circuit. It is not possible to generate output signals other than those determined in this way. Any changes beyond the available configuration options require circuit E to be significantly modified.

SUMMARY

In an embodiment, the present invention provides a circuit configured to generate periodic control signals including at least two mutually phase-shifted control signals. The circuit includes a plurality of generator circuits, where a separate generator circuit is provided for each control signal output by the circuit. Each generator circuit includes a phase value memory configured to store a phase value, where the phase value defines a phase shift. Each generator circuit includes an activation input and, in response to application of an activation level to the activation input, is configured to initiate a generation of a control signal which is phase-shifted by an amount defined by the phase value. The activation inputs of the generator circuits are connected together to an activation circuit for outputting an activation level to the generator circuits simultaneously.

BRIEF DESCRIPTION OF THE DRAWINGS

The present invention will be described in even greater detail below based on the exemplary figures. The invention is not limited to the exemplary embodiments. All features described and/or illustrated herein can be used alone or combined in different combinations in embodiments of the invention. The features and advantages of various embodiments of the present invention will become apparent by reading the following detailed description with reference to the attached drawings which illustrate the following.

DETAILED DESCRIPTION

An aspect of the present invention is to improve a circuit and method of the above-mentioned type in such a way that at least two mutually phase-shifted control signals can be generated in a flexible way. Another aspect is to disclose a corresponding method. Yet a further aspect is to provide a microscope and a method for controlling a microscope which will allow flexible setting of mutually phase-shifted control signals.

In an embodiment, the present invention provides a circuit that has a plurality of generator circuits, a separate generator circuit being provided for each control signal to be output by the circuit; in that each generator circuit has a phase value memory for storing a phase value, the phase value defining a phase shift; in that each generator circuit has an activation input and, in response to application of an activation level to the activation input, generates a control signal which is phase-shifted by the amount defined by the phase value; and in that the activation inputs of the generator circuits are connected together to an activation circuit for outputting an activation level to the generator circuits simultaneously.

In an embodiment, the present invention provides a method that includes the steps of: applying an activation level to activation inputs of the generator circuits in order to activate the generator circuits; loading a phase value from a phase value memory into the generator circuits; and generating a control signal which is phase-shifted by the amount defined by the phase value.

In an embodiment, the present invention provides a microscope including a circuit for generating periodic control signals; the control signals being phase-shifted with respect to each other; the control signals being used for controlling the components; and the circuit for generating the periodic control signals being provided by a circuit as described above.

In an embodiment, the present invention also provides a method for controlling a microscope having a plurality of electrically and/or electronically controllable components, using periodic control signals; the period control signals being generated using the method described above.

In accordance with the present invention, it was found, first of all, that in order to obtain a well-defined phase relationship between the individual control signals that are output, the individual control signals do not necessarily have to be generated by a common sequential logic circuit. Rather, in accordance with the present invention, the circuit has a plurality of separate generator circuits, each of which generates one of the mutually phase-shifted control signals. The generator circuits can be configured independently of each other, which significantly increases the freedom of configuration.

For purposes of defining the phase angles of the individual control signals, each generator circuit has a phase value memory which stores a phase value. This phase value defines a phase shift of the control signal generated by the respective generator circuit. By using a phase value memory for each generator circuit, a phase shift with respect to a common point in time can be defined across all generator circuits. While it is, in principle, possible to omit the phase value memory in one of the generator circuits and to use this generator circuit as a "reference", this would reduce the flexibility of the circuit.

Each generator circuit further has an activation input, via which the generator circuit can be set to a defined initial state. When an activation level is present at the activation input, the respective generator circuit initiates the generation of a control signal that is phase-shifted by the amount defined by the phase value. Thus, regardless of the state of a generator circuit prior to application of the activation signal, a defined output signal having a defined phase angle is generated.

An activation level at the activation input may activate the generator circuit and only thereby initiate the output of a control signal. Alternatively, the generator circuit may already output a control signal. The application of an activation signal to the activation input then causes the generator circuit to be (re-)set to a defined initial state. This may be used, for example, to re-synchronize circuits that are already in operation.

It should be noted that the activation level does not need to be permanently present at the activation input. Rather, it is sufficient that the activation level be applied at a defined event, such as a rising clock edge. In principle, it would also be possible to use a rising edge at the activation input to (re-)set the generator circuit to an initial state.

Moreover, in accordance with the present invention, the activation inputs of the individual generator circuits are connected to an activation circuit. The activation circuit feeds an activation level to the generator circuits simultaneously, whereupon the generator circuits simultaneously initiate the generation of the control signals. Because of these measures, the generator circuits generate and output control signals which have a defined phase relationship to each other. At the same time, a circuit is provided which can be set and used with great flexibility. In particular, the circuit is scalable to nearly any degree. By supplementing the circuit with an additional generator circuit, it is possible to generate an additional control signal. Since the additional generator circuit is also connected to the activation circuit and, therefore, receives an activation level simultaneously with all [other] generator circuits, the additional control signal will be synchronous without further measures. In this way, a highly scalable overall circuit is achieved.

In order to further improve the synchronism of the individual control signals, the generator circuits may be clocked by a common clock signal. Thus, the generator circuits always generate, in a defined manner, control signals which not only start together, but are also based on a common basic clock signal. If, in addition, the individual generator circuits are identical in design, the performance characteristics of the overall circuit can be further improved. Preferably, the clock signal is a periodic square wave signal.

In principle, a wide variety of different periodic signal trains may be generated as control signals. What is decisive is that a defined phase angle can be produced. However, in a preferred embodiment of the circuit, the control signals that are output are periodic pulse trains. Preferably, each pulse of the pulse train has the width of an active level of the clock signal. During the remaining duration of the period, the control signal may assume a low level.

Using the circuit of the present invention, it is in principle possible to produce control signals with a wide variety of different period durations. Control signals having different period durations can also be produced when a plurality of control signals are output. Due to the modular design of the circuit of the present invention, the period durations can be controlled separately for each generator circuit. Preferably, however, the circuit of the present invention outputs control signals which have the same period duration or whose period durations are integral multiples of each other.

In a preferred embodiment of the generator circuits, the generator circuits have a counter whose count value changes at an edge of the clock signal and which outputs a pulse when a predeterminable count value is reached. For this purpose, both up counters and down counters may be used. Also, the counters may change their count values in response to rising and/or falling edges.

However, it is preferred to use a down counter whose count value is decremented at each rising edge of the clock signal. In this case, the value 0 is used as the "predeterminable count value". This design allows the generator circuit to be built particularly easily and with little circuit complexity.

If the generator circuits are configured to have a down counter, the generator circuit may additionally have a start value memory in which is stored a start value. During operation, the counter would, for example, be decremented at each rising edge of the clock signal, and when the counter reaches 0, the start value would be loaded from the start value memory. At the next rising edge of the clock signal, the counter would be decremented further, starting from the start value. In this way, it is possible to produce pulse trains with a constant period duration.

In order to achieve a defined phase relationship of the individual control signals, the generator circuits could be configured such that when an activation level is present at the activation input, the phase value is loaded from the respective phase value memory into the counter. Thus, depending on the phase value, the counter is more or less "close" to the predeterminable count value at which the generation of a pulse is triggered. In this way, the phase relationship of the individual control signals can be defined in a simple manner.

In a particularly simple embodiment of the activation circuit, the activation circuit could evaluate the write accesses to the start value memory and/or the phase value memory of the generator circuits using an OR gate. In this way, any change of a start value and/or a phase value would reset the generator circuits and bring the individual generator circuits to a defined initial state according to the stored phase value.

Additionally or alternatively, the activation circuit may evaluate external events and, on this basis, generate the activation signals to the generator circuits. This can be done using a wide variety of different well-defined events. In the case of the preferred use of the inventive circuit in a scanning microscope, external events may be caused by the scanning process. In scanning microscopes, samples are generally scanned by an illuminating laser beam in a meander pattern. One example of an external event that may cause output of an activation level is the reaching of a reversal point during a change from one scan line to the next. Another example of an external event is when scanning of an image is complete and the illumination laser is moved back to an initial position. During the return movement, the generator circuits can be reset by generating an activation signal.

Preferably, the circuit of the present invention is used in connection with a confocal microscope, in particular in a fluorescence lifetime imaging (FLIM) microscope or in stimulated emission depletion (STED) microscopes. The control signals are then used to control the laser beams of the microscope. STED and FLIM microscopes are specially designed confocal microscopes, in which a sample to be examined is scanned by a laser beam. However, the control signals may also be used to control peripheral equipment.

Preferably, the start value memories and/or the phase value memories are in the form of as registers. This makes it possible to ensure that defined numbers are present in the memories. On the other hand, given a suitable design of the activation circuit, the write level required for the write access can be evaluated directly by the activation circuit and, in this manner, a unique activation signal can be generated.

The microscope according to the present invention includes a plurality of electrically and/or electronically controllable components. Control of the components is accomplished using a circuit according to the present invention which is capable of outputting periodic control signals to the respective components. In this context, the circuit can adjust the phase relationship between the individual control signals.

The components of the microscope may be a plurality of components. Very frequently, the components will include one or more laser light sources and, if applicable, a detection device. The components may further include actuators provided in or at the microscope. These actuators may be used, for example, to move a scanning device of the microscope, or to move the sample, for example, by moving the sample stage. Moreover, the components may include registers or memories, the write or read access to the register or memory being controlled by a control signal. Thus, one control signal may, for example, cause a value to be loaded into a register. Another control signal may enable access to an image memory of, for example, the detection device, or block access for a processing unit. Other components of the microscope may be processing units, in particular microprocessors. In this connection, a control signal may initiate the processing or analysis of data, or trigger a transmission of data to an internal or external display device. This listing already shows that it is possible to control a plurality of further microscope components known in the field.

It should be particularly noted once again that it is not mandatory that all of the control signals generated by the circuit be identical pulse trains that are merely shifted in phase. Rather, the generator circuits may be flexibly adapted such that a variety of different but mutually synchronous signals are output. Thus, for example, when using a FLIM microscope with PIE, one control signal may be used to generate a laser light beam having a first wavelength, and a second control signal, which is phase-shifted relative to the aforementioned control signal, may be used to activate a second laser beam having a second wavelength. A third control signal may be used to advance the scanning device by one image point. A further control signal may activate write accesses to individual registers of the circuit, while another control signals controls the reading from image memories of the detection device. This relatively simple enumeration illustrates very well how flexibly the circuit of the present invention can be used.

Figure 3:
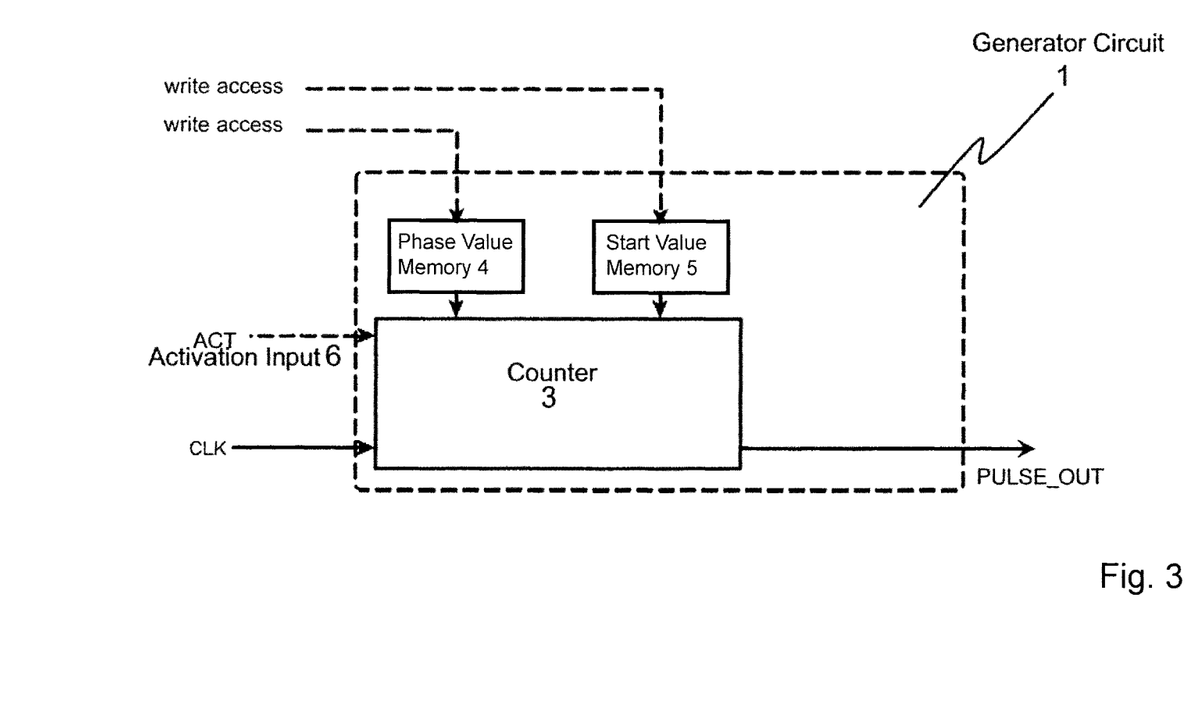
FIG. 3 illustrates an exemplary embodiment of a generator circuit for use in a circuit for generating control signals according to the present invention.

FIG. 3 shows an exemplary embodiment of a generator circuit 1 configured to generate and output a control signal. Generator circuit 1 is provided n times, depending on the number of control signals to be output. All n generator circuits together form the circuit for generating the control signals according to the present invention.

Generator circuit 1 includes a counter 3 which, in the present exemplary embodiment, is configured as a down counter. Counter 3 is clocked by a clock signal CLK, which decrements the counter at each rising edge; i.e., the count value is reduced by 1 at each rising edge of clock signal CLK.

Associated with the counter are two registers which are used as a phase value memory 4 and a start value memory 5. Phase value memory 4 has stored therein a phase value, and the start value memory contains a start value.

The counter further includes an activation input 6 via which an activation signal ACT can be fed to counter 3. Once an activation level is present at activation input 6, counter 3 starts. To this end, initially, the phase value is loaded as a count value from phase value memory 4 into the counter. At the next rising clock edge, the count value is decremented. Once a predeterminable count value, in the present exemplary embodiment a count value of 0, is reached, the counter generates a pulse which is output as a control signal PULSE_OUT. The pulse that is output has the width of an active level of the clock signal. In FIG. 2A, the width of the active level of the clock signal is indicated as $t_A$. In addition to generating a pulse, the start value stored in start value memory 5 is loaded as a new count value into counter 3, after which the count value is decremented again at the next rising edge. In this way, a pulse train is generated whose period duration T can be controlled via the start value in start value memory 5 and whose phase angle can be controlled via the phase value in the phase value memory.

The resolution of the generator circuit is mainly dependent on the frequency of clock signal CLK and the widths of the counter, of the phase value memory, and of the start value memory. The larger their bit width, the more rising edges of the clock signal can be counted.

As is readily discernible, clock signal CLK may run substantially continuously, so that no additional switching means need to be provided for activating and deactivating the clock. Activation signal ACT is used to control counter 3 and to synchronize the individual generator circuits 1 with respect to each other. There is no need for additional means, which would make the circuit more complicated.

Figure 4:
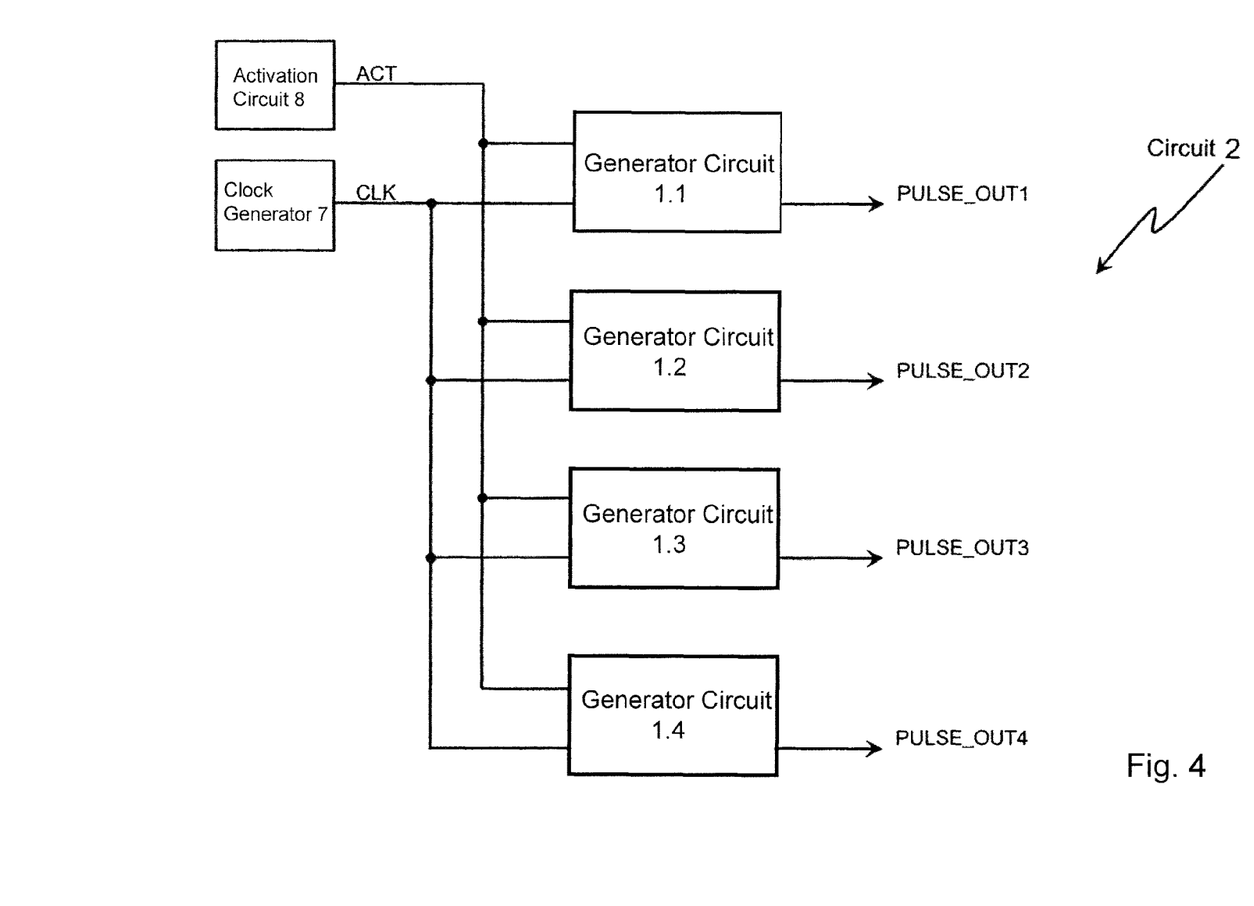
FIG. 4 depicts an exemplary embodiment of a circuit according to the present invention for generating a plurality of control signals, which uses generator circuits according to FIG. 3.

FIG. 4 shows, by way of example, a circuit 2 for generating 4 control signals PULSE_OUT1 through PULSE_OUT4. To this end, 4 generator circuits are provided, designated as 1.1, 1.2, 1.3 and 1.4, each of which generates and outputs one of the control signals PULSE_OUT1 through PULSE_OUT4. Generator circuits 1.1, 1.2, 1.3 and 1.4 are configured according to FIG. 3.

Generator circuits 1.1, 1.2, 1.3 and 1.4 are clocked by a common clock signal CLK, which is generated by a clock generator 7. It should be clear that the clock generator does not necessarily have to provided only to serve the generator circuits. Rather, the clock generator may also serve further circuit elements or circuits, or the clock generator may be used by other components of a larger system.

For purposes of generating the activation signal ACT, circuit 2 includes an activation circuit 8 which generates an activation level simultaneously to all generator circuits 1 of the circuit 2 according to the present invention. This is symbolized in FIG. 4 by a common line to all generator circuits 1. However, the activation circuit may also include a separate driver stage for each generator circuit, so that each generator circuit is controlled via a separate line. The individual driver stages would nevertheless together receive an activation level.

Activation circuit 8 is used to synchronize the individual generator circuits 1 with respect to each other. In a preferred exemplary embodiment, activation circuit 8 evaluates the write accesses to phase value memory 4 and/or to start value memory 5 of generator circuits 1. In the example shown in FIG. 4, eight logic levels would be logically combined by an OR gate. Once a write access is made to one of the registers, an activation level is generated, and the generator circuits are reset to an initial state.

Figure 5:
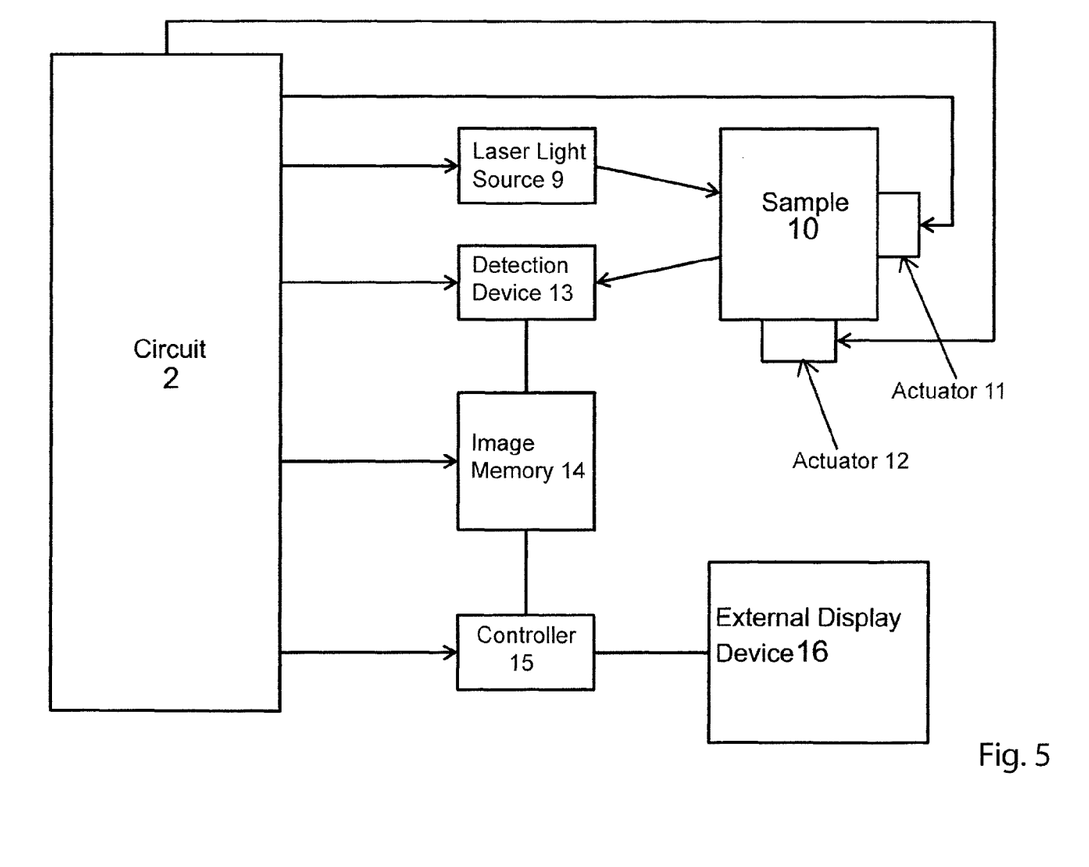
FIG. 5 shows a block diagram of a microscope according to the present invention, which uses a circuit according to FIG. 4.

FIG. 5 shows a block diagram of a microscope according to the present invention, which uses a circuit according to the invention and shown in FIG. 4. Circuit 2 generates six difference control signals, all of which can be adjusted in period duration and phase angle using the method described above. The control signals control components of the microscope according to the present invention. In the exemplary embodiment described, these components include a laser light source 9, actuators 11 and 12 for moving the sample, a detection device 13, an image memory 14 and a controller 15 for an external display device 16.

During operation of the microscope, a control signal output by circuit 2 controls laser light source 9. Control includes, in particular, varying the intensity. The laser light source generates an illumination beam, which scans a sample 10. The sample can be moved in the x- and y-directions by actuators 11 and 12. To this end, circuit 2 generates control signals which have a fixed phase relationship to the control signal for controlling the laser light source. The detection light coming from the sample, which is produced by reflection of the illumination beam or by fluorescence of the sample, passes through a detection device 13, which is controlled as a function of the laser light source. The image information obtained by detection device 13 is stored in an image memory, access to which is controlled by another control signal generated by circuit 2. The image information stored in the image memory can be read out by a controller 15 for a display device 16 and be suitably processed for the display. The processing is controlled by another control signal generated by the circuit.

With regard to further advantageous embodiments of the circuit and the method according to the present invention, and to avoid repetition, reference is made to the general part of the description and to the appended claims.

Finally, it should be particularly noted that the above-described exemplary embodiments of the circuit according to the present invention are merely intended to illustrate the claimed teaching, but not to limit it to such embodiments.

LIST OF REFERENCE NUMERALS

A pulse generator
B comparison value
C register (for the comparison value)
D output (of the pulse generator)
E circuit
F configuration (for circuit F)
CLK clock signal
PULSE_OUT control signal
ACT activation signal
1 generator circuit
2 circuit
3 counter
4 phase value memory
5 start value memory
6 activation input
7 clock generator
8 activation circuit
9 laser light source
10 sample
11 actuator for moving the sample in the x-direction
12 actuator for moving the sample in the y-direction
13 detection device
14 image memory
15 controller for the display
16 external display device

What is claimed is:

1. A circuit configured to generate and output periodic control signals including at least two mutually phase-shifted control signals, the circuit comprising:
   a plurality of generator circuits clocked together by a clock signal, a separate generator circuit being provided for each control signal output by the circuit;
   each of the plurality of generator circuits including a phase value memory configured to store a phase value, the phase value defining a phase shift;
   the each generator circuit further including an activation input and, in response to application of an activation level to the activation input, is configured to initiate a generation of a control signal which is phase-shifted by an amount defined by the phase value;
   the each generator circuit further having a counter whose count value changes at an edge of the clock signal, the counter being configured to output a pulse upon a predeterminable count value being reached;
   wherein the activation inputs of the generator circuits are connected together to an activation circuit for outputting the activation level to the generator circuits simultaneously,
   wherein each of the generator circuits are configured such that when the activation level is present at the activation input, the phase value is loaded from the phase value memory into the counter,
   wherein, after the phase value is loaded from the phase value memory into the counter, the counter stores the phase value as an initial count value, and
   wherein each generator circuit has a start value memory for storing a start value, the counter being loaded with the start value when the predeterminable count value is reached.

2. The circuit as recited in claim 1, wherein the control signals that are output are periodic pulse trains, and each pulse of the pulse train having a width ($t_A$) of an active level of the clock signal.

3. The circuit as recited in claim 1, wherein the counter is configured as a down counter having a count value that is configured to decrement at each rising edge of the clock signal.

4. The circuit as recited in claim 1, wherein the activation circuit is configured to evaluate the write accesses to at least one of the start value memory or the phase value memory of the generator circuits using an OR gate.

5. The circuit as recited in claim 1, wherein the circuit is configured to generate control signals for a confocal microscope.

6. The circuit recited in claim 5, wherein the confocal microscope is fluorescence lifetime imaging (FLIM) microscope or a stimulated emission depletion (STED) microscope.

7. The circuit recited in claim 5, wherein the controls signals are configured to control laser beams of the microscope.

8. A method for generating periodic control signals using a circuit having a plurality of generator circuits, each of which is configured to generate and output one of the periodic control signals, the method comprising the steps of:
   applying an activation level to activation inputs of the generator circuits to activate the generator circuits;
   loading, into a counter of each of the generator circuits, a phase value from a phase value memory of the respective generator circuit, wherein, after the phase value is loaded from the phase value memory of the respective generator circuit into each counter, each counter stores the phase value as an initial count value;
   changing a count value of the counters at an edge of a clock signal, by which the generator circuits are clocked together;
   generating one of the periodic control signals which is phase-shifted by an amount defined by the phase value, wherein a pulse is generated and output as the control signal upon reaching a predeterminable count value; and
   loading, into the counter of each of the generator circuits, a start value from a start value memory of the respective generator circuit.

9. The method as recited in claim 8, wherein the counter is decremented or incremented at each rising edge of the clock signal.

10. A microscope having a plurality of controllable components, the components being controllable at least one of electrically or electronically, the microscope including a circuit for generating periodic control signals for controlling the components, the circuit comprising:
    a plurality of generator circuits clocked together by a clock signal, a separate generator circuit being provided for each control signal output by the circuit;
    each generator circuit of the plurality of generator circuits including a phase value memory configured to store a phase value, the phase value defining a phase shift;
    the each generator circuit further including an activation input and, in response to application of an activation level to the activation input, is configured to initiate a generation of a control signal which is phase-shifted by an amount defined by the phase value;
    the each generator circuit further having a counter whose count value changes at an edge of the clock signal, the counter being configured to output a pulse upon a predeterminable count value being reached;
    wherein the activation inputs of the generator circuits are connected together to an activation circuit for outputting the activation level to the generator circuits simultaneously,
    wherein each of the generator circuits are configured such that when the activation level is present at the activation input, the phase value is loaded from the phase value memory into the counter,
    wherein, after the phase value is loaded from the phase value memory into the counter, the counter stores the phase value as an initial count value, and
    wherein each generator circuit has a start value memory for storing a start value, the counter being loaded with the start value when the predeterminable count value is reached.

11. The microscope as recited in claim 10, wherein the components of the microscope include at least one of a laser light source, an actuator for moving a scanning device of the microscope, a detection device, an actuator for moving the sample, a register in a controller, an image memory of a detection device, a controller for transferring data or a processing unit for analyzing data.

12. A method for controlling a microscope having a plurality of controllable components, the components being controllable at least one of electrically or electronically, the method comprising using periodic control signals generated using the steps of:
    applying an activation level to activation inputs of generator circuits to activate the generator circuits;
    loading, into a counter of each of the generator circuits, a phase value from a phase value memory of the respective generator circuit, wherein, after the phase value is loaded from the phase value memory of the respective generator circuit into each counter, each counter stores the phase value as an initial count value;

changing a count value of the counters at an edge of a clock signal, by which the generator circuits are clocked together;

generating a control signal of the periodic control signals which is phase-shifted by an amount defined by the phase value, wherein a pulse is generated and output as the control signal upon reaching a predeterminable count value; and loading, into the counter of each of the generator circuits, a start value from a start value memory of the respective generator circuit.

* * * * *